(12) United States Patent
Szu-Lu et al.

(10) Patent No.: US 6,580,349 B2
(45) Date of Patent: Jun. 17, 2003

(54) GUIDING DEVICE FOR GUIDING CONDUCTING WIRE SOLDERED ON PRINTED CIRCUIT BOARD

(75) Inventors: Huang Szu-Lu, Taoyuan (TW); Lin Wen-Hsiang, Taoyuan (TW)

(73) Assignee: Delta Electronics, Inc., Taoyuan Shien (TW)

( * ) Notice: Subject to any disclaimer, the term of this patent is extended or adjusted under 35 U.S.C. 154(b) by 0 days.

(21) Appl. No.: 09/844,472

(22) Filed: Apr. 27, 2001

(65) Prior Publication Data

US 2002/0050907 A1 May 2, 2002

(30) Foreign Application Priority Data

Oct. 30, 2000 (TW) ...................................... 89218830 U

(51) Int. Cl.⁷ ............................................... H01F 27/29
(52) U.S. Cl. ...................................... 336/192; 336/200
(58) Field of Search ................................ 336/65, 90, 6, 336/96, 107, 192, 200

(56) References Cited

U.S. PATENT DOCUMENTS

| 4,092,622 | A | * | 5/1978 | Widemann et al. | 336/192 |
| 5,235,305 | A | * | 8/1993 | Scheffler | 336/192 |
| 5,760,505 | A | * | 6/1998 | Farou et al. | 310/71 |

* cited by examiner

*Primary Examiner*—Tuyen T. Nguyen
(74) *Attorney, Agent, or Firm*—Reising, Ethington, Barnes, Kisselle PC

(57) ABSTRACT

A guiding device is provided for guiding a conducting wire extended out from an electronic device to be soldered on a printed circuit board. The guiding device includes a base for supporting and fixing the conducting wire thereon, a first offset board connected to one end of the base for forming a space with an extending portion of the conducting wire when the conducting wire is fixed on the base and a second offset board connected to the other end of the base, which has a hole in a connection portion thereof for preventing the heat from being conducted to the printed circuit board when the conducting wire is soldered on the printed circuit board.

2 Claims, 7 Drawing Sheets

GUIDING DEVICE FOR GUIDING CONDUCTING WIRE SOLDERED ON PRINTED CIRCUIT BOARD

FILED OF THE INVENTION

The present invention relates to a guiding device for guiding a conducting wire extended out from an electronic device. More specially, the present invention provides a guiding device to precisely solder the conducting wire on a printed circuit board.

BACKGROUND OF THE INVENTION

When producing goods, soldering the conducting wire is an important method to electrically connect two components on a printed circuit board. Meanwhile, the problems of the wrong soldered position and the bad fixed efficiency are often ignored by careless examining procedure. For example, when an electronic device, e.g. a transformer, is electrically connected to a printed circuit board, the conducting wire of the transformer must be converged and then extended out from the transformer to be soldered on the printed circuit board. FIG. 1 shows a conducting wire extended out from an electrical component to be soldered on a printed circuit board. The conducting wire 14 is directly extended out from the converter 11 and soldered to the contact pad 13 on the printed circuit board 12.

FIG. 2 and FIG. 3 are respectively illustrated other types of transformers in the prior art. The terminal conducting wire 24 is winding wire of mother transformer 21 and directly connected to a contact pad 23 to be soldered on a printed circuit board 202. The terminal conducting wires 24 and 34 in FIG. 2 and FIG. 3 are horizontal and vertical respectively soldered to the contact pads 23 and 33.

As can be seen in FIG. 1 to FIG. 3, because no guiding devices or fixing elements are used to guide or support the conducting wire, the conducting wire extended out from printed circuit board is not easy to be soldered on the printed circuit board.

Furthermore, in the prior art, excess solder is required to connect the terminal of the conducting wire with the contact pad, and the area of the soldering point inevitably large, which increase the cost of the material.

In addition, if too much solder were soldered on the print circuit board, the excess solder would flow around the print circuit board. Thus, the yield of the peripheral circuit will be reduced and the electrical connection on the printed circuit board will suffer from the great damages. Moreover, when the conducting wire is incorrectly soldered on the printed circuit board, the contact region around the soldering point need to be further processed to obtain a fine correct conductor arrangement on the printed circuit board. Sometimes, the processing procedure is quite difficult for the workers to dispose the contact region between the conducting wires and the soldering point.

Furthermore, the heat produced by soldering will be transmitted from the conducting wire into the electrical device or other outside components, which also can reduce the conducting efficacy of the printed circuit board and further damage the other components disposed on the printed circuit board.

Therefore, it is an attempt by the applicant to provide a guiding device to solve the problems as described above.

SUMMARY OF THE INVENTION

It is therefore an object of the present invention to provide a guiding device for precisely soldering the conducting wire on the printed circuit board.

According to the present invention, there is provided a guiding device for guiding a conducting wire extended out from an electronic device to be soldered on a printed circuit board. The guiding device includes a base for supporting the conducting wire thereon and plural fixing elements protruding from the side edges of the base for fixing the conducting wire.

Preferably, the electronic device is a transformer. The conducting wire is a winding wire of the transformer.

Preferably, the guiding device further includes a first offset board connected to one end of the base for forming a space with an extending portion of the conducting wire when the conducting wire is fixed on the base.

Preferably, the space is used for receiving solder to prevent the solder from flowing around the printed circuit board.

Preferably, the guiding device further comprises a second offset board connected to the other end of the base and having a hole formed on a connection portion thereof for preventing the heat from being conducted to the printed circuit board when the conducting wire is soldered to the printed circuit board.

It is therefore another object to provide a guiding device for guiding a conducting wire extended out from an electronic device to be soldered on a printed circuit board.

According to the present invention, there is provided a guiding device includes a base for supporting and fixing the conducting wire thereon, a first offset board connected to one end of the base for forming a space with an extending portion of the conducting wire when the conducting wire is fixed on the base and a second offset board connected to the other end of the base having a hole in a connection portion thereof for preventing the heat from being conducted to the printed circuit board when the conducting wire is soldered on the printed circuit board.

Preferably, the base comprises plural fixing elements protruding from the side edges thereof for fixing the conducting wire.

It is therefore a further object to provide an electronic device to be fixed directly on a printed circuit board.

According to the present invention, there is provided an electrical device adapted to be fixed on a printed board including a conducting wire collector for collecting a conducting wire, a guiding device connected to the conducting wire collector for guiding the conducting wire extended out from the conducting wire collector to be soldered on the printed circuit board. And the guiding device includes a base for supporting the conducting wire thereon and plural fixing elements protruding from the side edges of the base for fixing the conducting wire.

Preferably, the conducting wire is a winding wire of the transformer.

Preferably, the guiding device further includes a first offset board connected to one end of the base for forming a space with an extending portion of the conducting wire when the conducting wire is fixed on the base.

Preferably, the space is used for receiving solder to prevent the solder from flowing around the printed circuit board.

Preferably, the guiding device further includes a second offset board having one end connected to the conducting wire collector and a hole formed on a connection portion thereof for preventing the heat from being conducted to the printed circuit board when the conducting wire is soldered to the printed circuit board.

A better understanding of the present invention can be obtained when the following detailed description of preferred embodiments are considered in conjunction with the following drawings, in which:

DETAILED DESCRIPTION OF THE EMBODIMENTS

Figure 1:
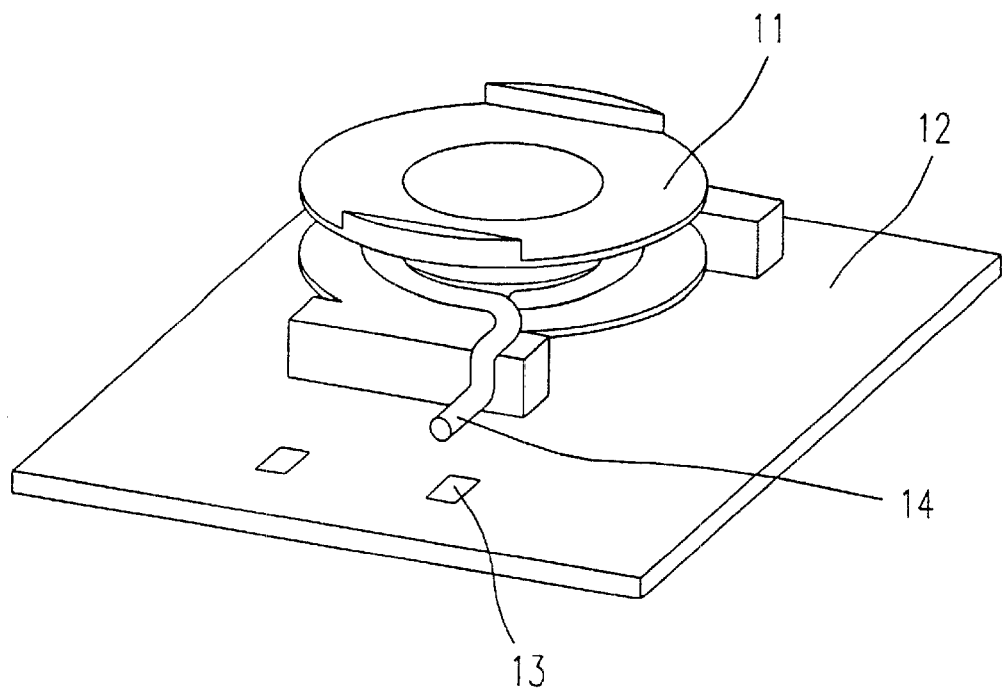
FIG. 1 is a schematic view illustrating a terminal conducting wire extended out from a transformer to be soldered on a printed circuit board in the prior art.
Figure 4:
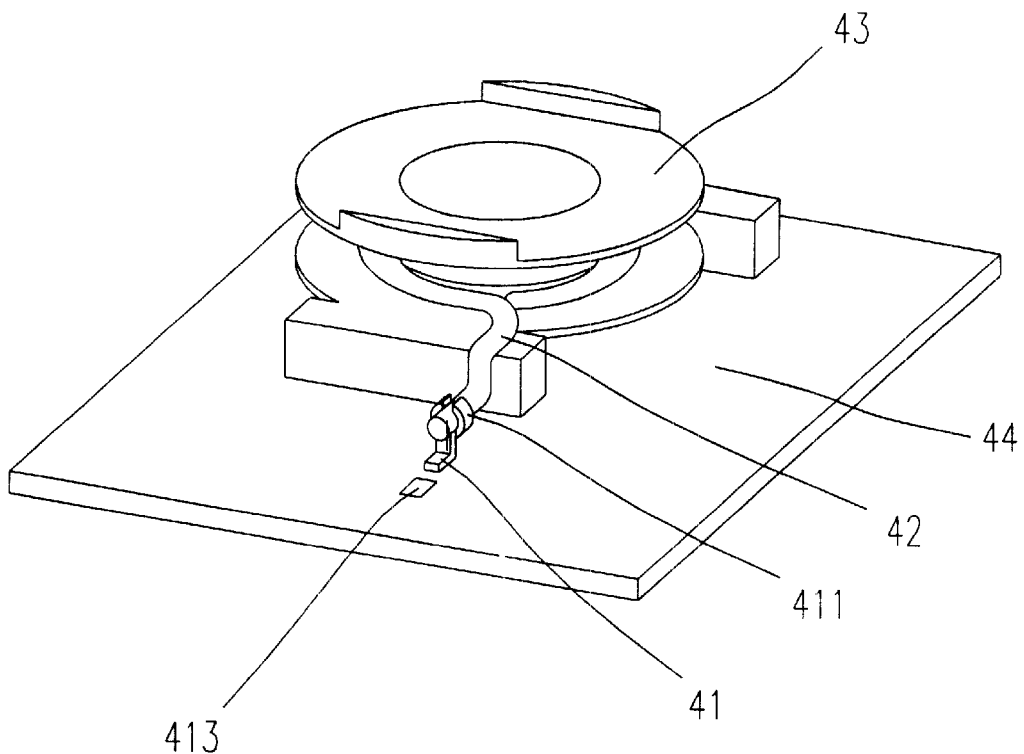
FIG. 4 is a schematic view illustrating the guiding device of the present invention applied in a terminal conducting wire in FIG. 1.

A guiding device 41 shown in FIG. 4 is used for guiding a conducting wire 42 extended out from a transformer 43 to be soldered on the printed circuit board 44. The structure of the transformer 43 is the same as that of the transformer 11 shown in FIG. 1. The guiding device 41 includes a fixing element 411, e.g. a loop, to guide and fix the conducting wire 42.

Figure 2:
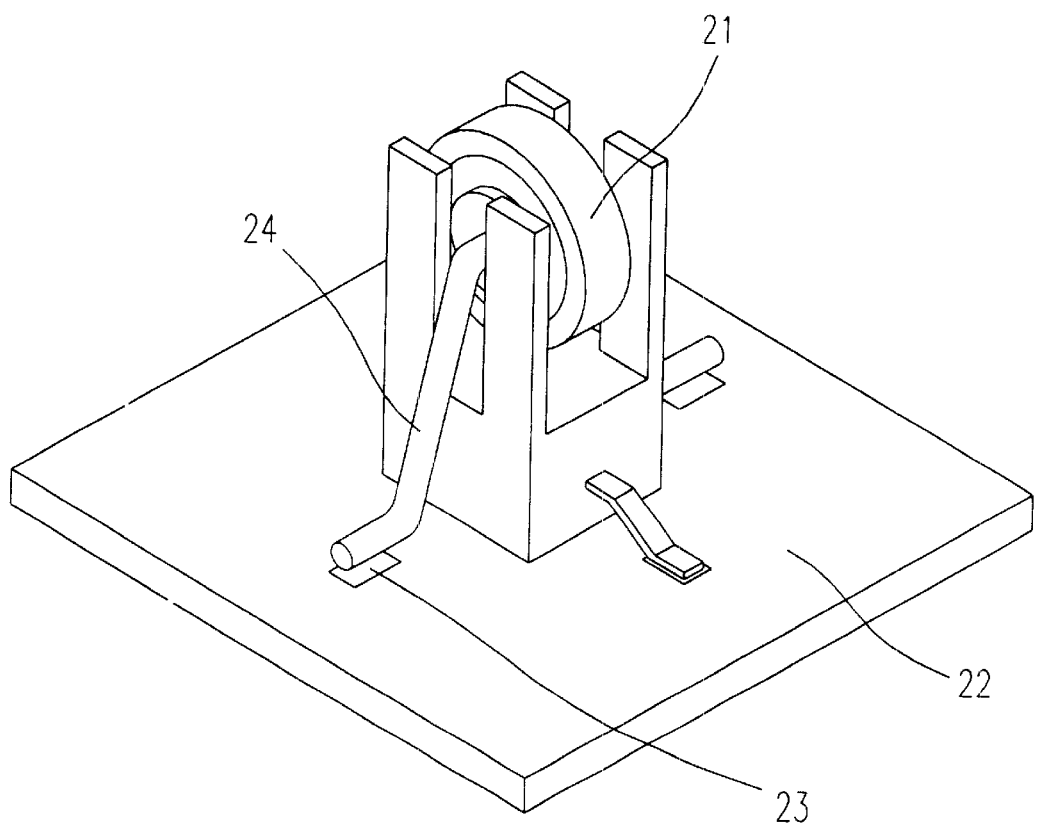
FIG. 2 is a schematic view illustrating a terminal conducting is contacted with a contact pad of a printed circuit board in the prior art, wherein the terminal conducting wire is horizontal to the contact pad.
Figure 5:
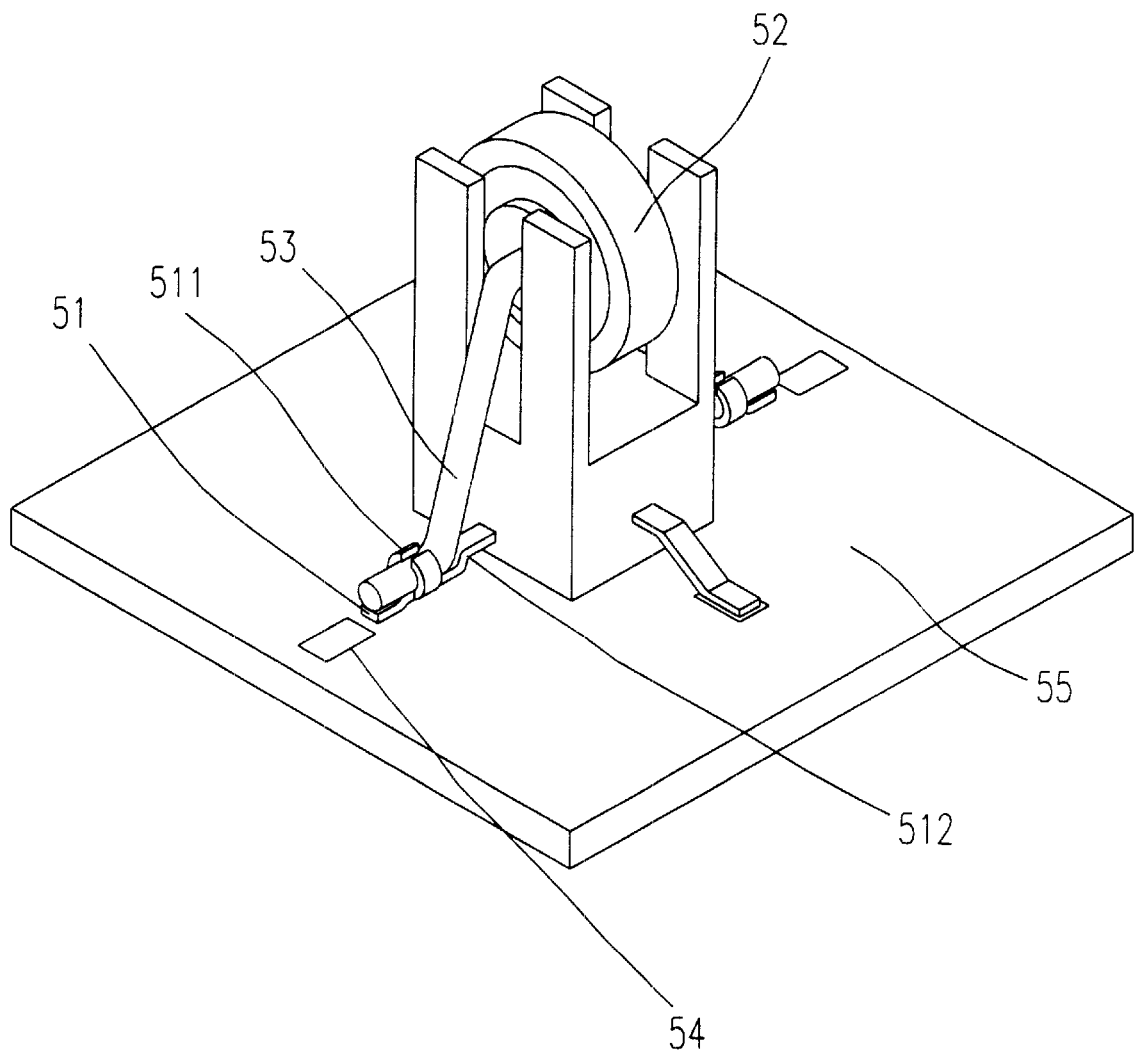
FIG. 5 is a schematic view illustrating the guiding device of the present invention applied in a terminal conducting wire in FIG. 2.

FIG. 5 shows the guiding device 51 in the present invention is applied to a transformer 52 whose structure is the same as that shown in FIG. 2 for guiding a conducting wire 53 to be soldered to a contact pad 54 on a print circuit board 55. Besides a fixing element 511, the guiding device 51 shown in FIG. 5 also has a base 512 disposed thereon for supporting the conducting wire 52.

Figure 3:
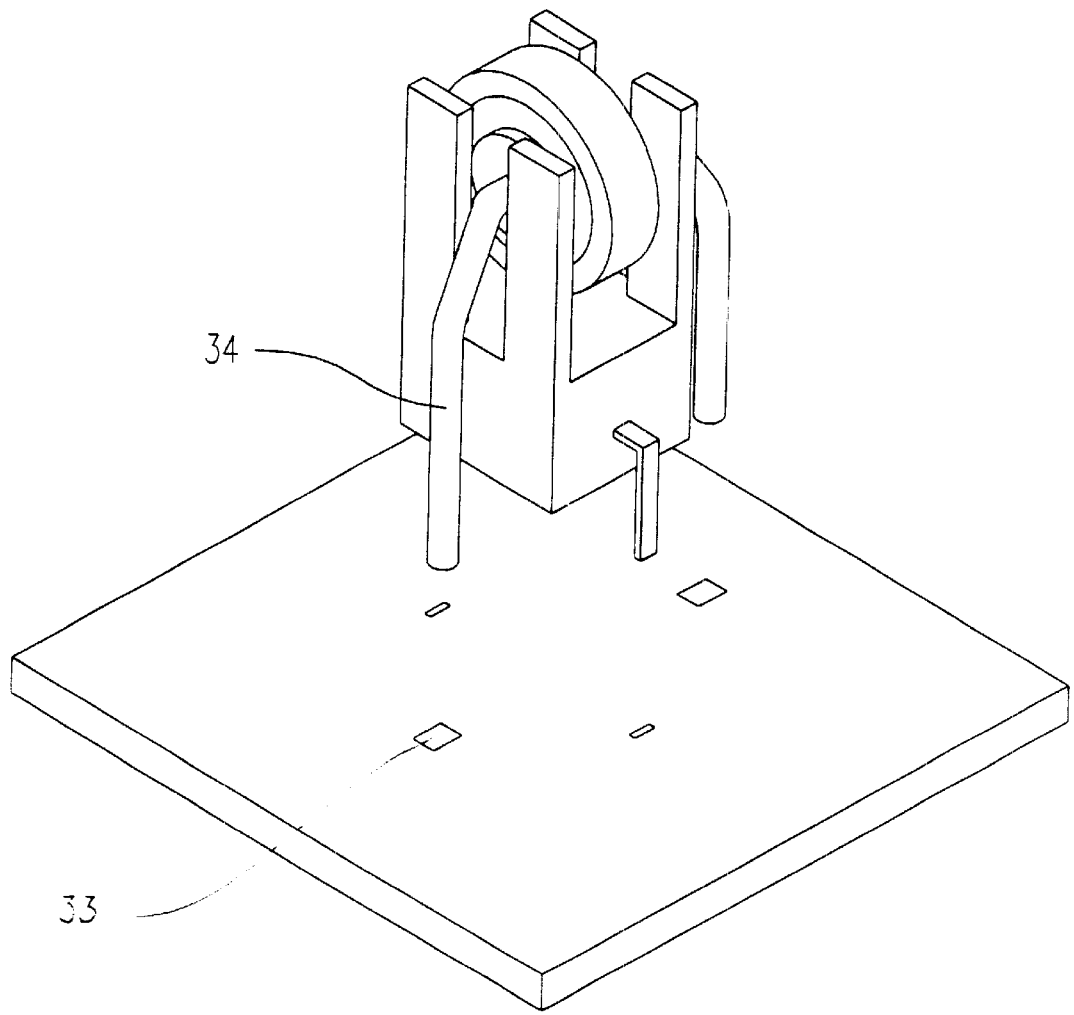
FIG. 3 is a schematic view illustrating a terminal conducting is contacted with a contact pad of a printed circuit board in the prior art, wherein the terminal conducting wire is vertical to the contact pad.
Figure 6:
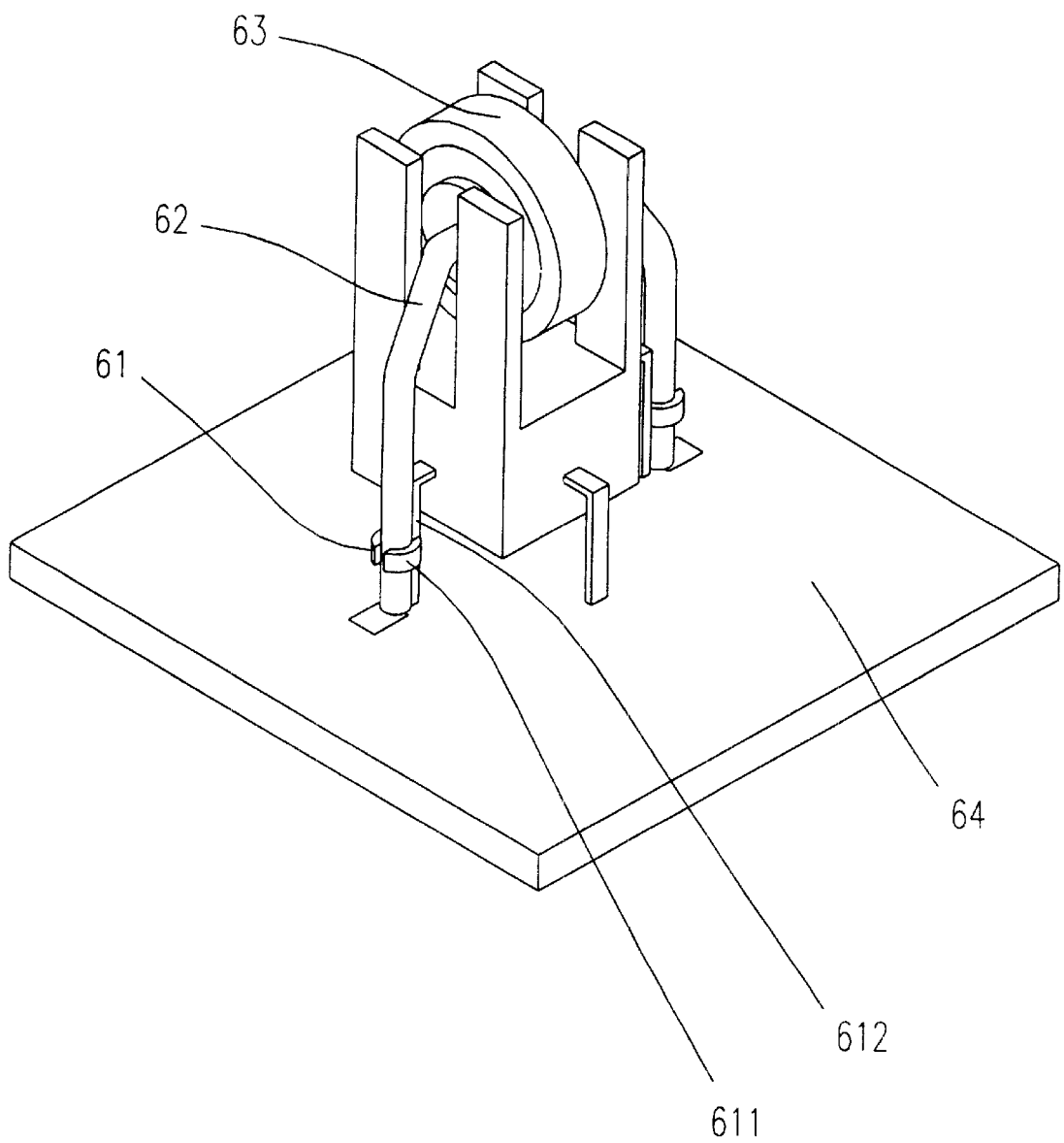
FIG. 6 is a schematic view illustrating the guiding device of the present invention applied in a terminal conducting wire in FIG. 3.

FIG. 6 shows the guiding device 61 in the present invention is applied to a transformer 63 whose structure is the same as that shown in FIG. 3. The transformer 63 has an extended-out conducting wire 62 to be soldered on the printed circuit board 64. The guiding device 61 can straightly guide the conducting wire 62 to be soldered on the printed circuit board 64 by the support of a fixing element 611 and the guiding of vertical base 612.

Figure 7:
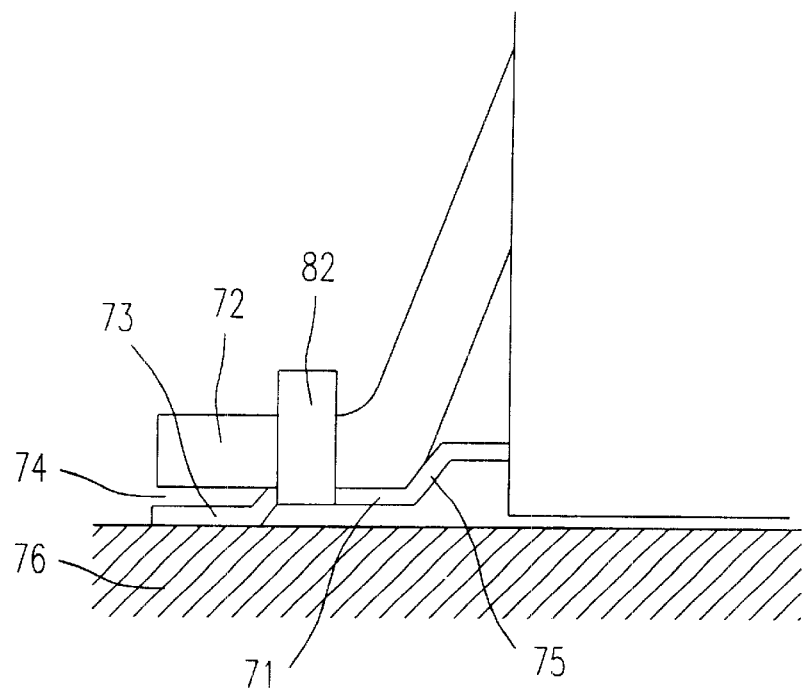
FIG. 7 is a side view showing the structure of the guiding device according to the embodiment in the present invention.
Figure 8:
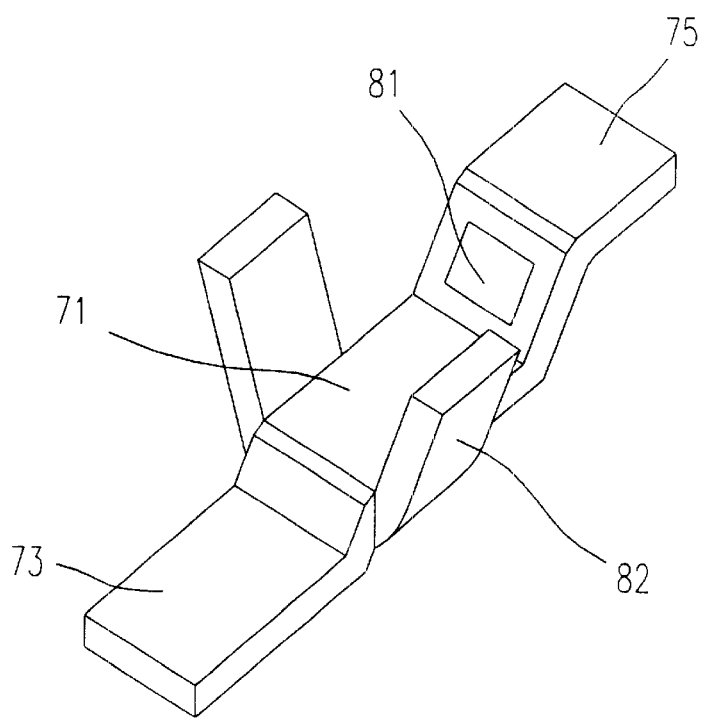
FIG. 8 is a perspective view showing the structure of the guiding device in FIG. 7.

Please refer to FIG. 7 and FIG. 8. In the embodiment, the guiding device includes a base 71, a first offset board 73, a second offset board 85, plural fixing elements 82 and a hole 81. FIG. 7 is the side view showing the structure of the guiding device for guiding a conducting wire 72 extended out from a transformer according to the embodiment of the present invention. FIG. 8 is a perspective view showing the structure of the guiding device in FIG. 7. The base 71 is used for supporting the conducting wire 72 thereon. The first offset board 73 connected to one end of the base 71 for forming a space 74 with an extending portion of the conducting wire 72 when the conducting wire 82 is fixed on the base 71. The second offset board 75 is connected to the other end of the base 71 and has the hole 81 formed on a connection portion thereof for preventing the heat from being conducted to the printed circuit board 75 when the conducting wire 73 is soldered to the printed circuit board 75 and plural fixing elements 72 protruding from the side edges of the base 71 for fixing the conducting wire 72. Certainly, the hole 81 in the guiding device can be made of plural holes to quickly and respectively emit the heat.

Accordingly, the guiding device disclosed in the present invention can efficiently guide and fix the conducting wire to be soldered on the printed circuit board by the plural fixing element and the base as described above. The first offset board is also provided to prevent solder from flowing around the printed circuit board to pollute the peripheral electrical devices on the printed circuit board. The first offset board in the guiding device further bears other advantages of easily controlling the volume of the solder and increasing the working region on the printed circuit board by reducing the soldering point between the contact pad and the solder. And the hole disposed on the guiding device is used for emitting a portion of the heat produced by soldering the conducting wire so as to avoid damaging the electrical devices.

Additional advantages and modifications will readily occur to those skilled in the art. Therefore, the invention in its broad aspects is not limited to the specific details, and representative devices shown and described herein. Accordingly, various modifications may be made without departing from the spirit or scope of the general inventive concepts as defined by appended claims and their equivalents.

What we claimed is:

1. A guiding device for guiding a conducting wire extended out from an electronic device to be soldered on a printed circuit board, comprising:

a base for supporting and fixing said conducting wire thereon;

a first offset board connected to one end of said base for forming a space with an extending portion of said conducting wire when said conducting wire is fixed on said base; and a second offset board connected to the other end of said base and having a hole in a connection portion thereof for preventing the heat from being conducted to said printed circuit board when said conducting wire is soldered on said printed circuit board.

2. The guiding device according to claim 1, wherein said base comprises plural fixing elements protruding from the side edges thereof for fixing said conducting wire.

* * * * *